United States Patent
Lee et al.

(10) Patent No.: US 10,355,074 B2
(45) Date of Patent: *Jul. 16, 2019

(54) MONOLAYER THIN FILM CAPACITOR AND METHOD FOR MANUFACTURING THE SAME

(71) Applicant: SAMSUNG ELECTRO-MECHANICS CO., LTD., Suwon-si, Gyeonggi-do (KR)

(72) Inventors: Jong Pil Lee, Suwon-si (KR); Jong Bong Lim, Suwon-si (KR); Hai Joon Lee, Suwon-si (KR); Ji Hyun Park, Suwon-si (KR)

(73) Assignee: SAMSUNG ELECTRO-MECHANICS CO., LTD., Suwon-si, Gyeonggi-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/890,838

(22) Filed: Feb. 7, 2018

(65) Prior Publication Data

US 2018/0166528 A1   Jun. 14, 2018

Related U.S. Application Data

(63) Continuation of application No. 15/271,942, filed on Sep. 21, 2016, now Pat. No. 9,923,048.

(30) Foreign Application Priority Data

Feb. 25, 2016 (KR) .................. 10-2016-0022444

(51) Int. Cl.
*H01L 23/522* (2006.01)
*H01L 49/02* (2006.01)
*H01L 23/528* (2006.01)

(52) U.S. Cl.
CPC .......... *H01L 28/75* (2013.01); *H01L 23/5222* (2013.01); *H01L 23/5226* (2013.01); *H01L 23/5283* (2013.01)

(58) Field of Classification Search
CPC ..................... H01L 28/75; H01L 27/3265
See application file for complete search history.

(56) References Cited

U.S. PATENT DOCUMENTS 9,923,048 B2 * 3/2018 Lee ..................... H01L 28/75
2004/0084709 A1   5/2004 Kim et al.
(Continued)

FOREIGN PATENT DOCUMENTS

JP    2007-194472 A    8/2007
JP    2007-294937 A    11/2007

OTHER PUBLICATIONS

Notice of Allowance issued in corresponding parent U.S. Appl. No. 15/271,942, dated Nov. 9, 2017.

*Primary Examiner* — Thao P Le
(74) *Attorney, Agent, or Firm* — Morgan, Lewis & Bockius, LLP

(57) ABSTRACT

A monolayer thin film capacitor includes: a bottom electrode; a top electrode; a dielectric layer disposed between the bottom electrode and the top electrode; a first via formed in the dielectric layer so as to penetrate through the dielectric layer; a second via formed in the top electrode so as to penetrate through the top electrode and having a greater width or a greater diameter than that of the first via; and a connection electrode disposed on inner sides of the first and second vias, electrically connected to the bottom electrode, and electrically insulated from the top electrode.

8 Claims, 7 Drawing Sheets

(56) References Cited

U.S. PATENT DOCUMENTS

| | | | |
|---|---|---|---|
| 2004/0104451 A1* | 6/2004 | Ooi | H01G 4/224 257/532 |
| 2007/0230086 A1 | 10/2007 | Saita et al. | |
| 2007/0235790 A1 | 10/2007 | Kim et al. | |
| 2010/0032803 A1 | 2/2010 | Lippitt, III et al. | |
| 2013/0001577 A1* | 1/2013 | Kim | H01L 29/45 257/71 |
| 2013/0285200 A1 | 10/2013 | Chang et al. | |
| 2015/0264813 A1* | 9/2015 | Zhou | H05K 1/162 174/255 |
| 2016/0027813 A1* | 1/2016 | Xu | H01L 27/3265 257/71 |
| 2016/0027857 A1* | 1/2016 | Jin | H01L 27/3258 257/71 |

* cited by examiner

MONOLAYER THIN FILM CAPACITOR AND METHOD FOR MANUFACTURING THE SAME

CROSS-REFERENCE TO RELATED APPLICATION(S)

This application is a Continuation of U.S. application Ser. No. 15/271,942, filed on Sep. 21, 2016 which claims benefit of priority to Korean Patent Application No. 10-2016-0022444 filed on Feb. 25, 2016 in the Korean Intellectual Property Office, the disclosure of which is incorporated herein by reference in their entirety.

TECHNICAL FIELD

The present disclosure relates to a monolayer thin film capacitor and a method for manufacturing the same.

BACKGROUND

In accordance with the expansion of markets for mobile communication devices and a portable electronic devices, demand for capacitors having a subminiature size and high capacity at the same time has increased. Accordingly, a miniaturized multilayer ceramic capacitor (MLCC) having high capacity at the same time has been widely used for a variety of electronic devices.

A conventional MLCC has been manufactured by a process of stacking dozens or hundreds of ceramic sheets to which electrode paste is applied, and forming electrodes on both ends of the stacked ceramic sheets. However, such a bulk process has a limit in implementing new miniaturization or high capacity.

In particular, a technology of embedding passive elements such as inductors, capacitors, and the like, in a circuit board, has been researched, in line with the trend for the miniaturization of electronic devices. A board embedded-type capacitor needs to reduce an area occupied by the passive elements embedded in the board and to significantly reduce a height of the passive elements.

A monolayer thin film capacitor has an advantage that it is advantageous in the reduction of the occupancy area required by the board embedded-type capacitor as well as in a significant reduction in the height of the capacitor.

A method capable of more significantly reducing the height of the monolayer thin film capacitor and simplifying a process of manufacturing the monolayer thin film capacitor is required.

SUMMARY

An aspect of the present disclosure may provide a monolayer thin film capacitor having a significantly reduced height and a significantly reduced occupancy area.

An aspect of the present disclosure may also provide a method for manufacturing a monolayer thin film capacitor which is significantly economical by significantly reducing a process of manufacturing the same, and having excellent reliability at the same time.

According to an aspect of the present disclosure, a monolayer thin film capacitor may include: a bottom electrode; a top electrode; a dielectric layer disposed between the top electrode and the bottom electrode; a first via formed in the dielectric layer so as to penetrate through the dielectric layer; a second via formed in the top electrode so as to penetrate through the top electrode and having a greater width or a greater diameter than that of the first via; and a connection electrode disposed on inner sides of the first and second vias, electrically connected to the bottom electrode, and electrically insulated from the top electrode.

According to another aspect of the present disclosure, a method for manufacturing a monolayer thin film capacitor may include: preparing a bottom electrode; forming a dielectric layer and a first via on the bottom electrode; forming a first metal layer on the dielectric layer on which the first via is formed; forming a second metal layer in which a second via is formed after disposing a second via formation member around the first via on the first metal layer; and forming a connection electrode and a top electrode by removing the second via formation member and etching the exposed first metal layer.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Monolayer Thin Film Capacitor

Figure 1:
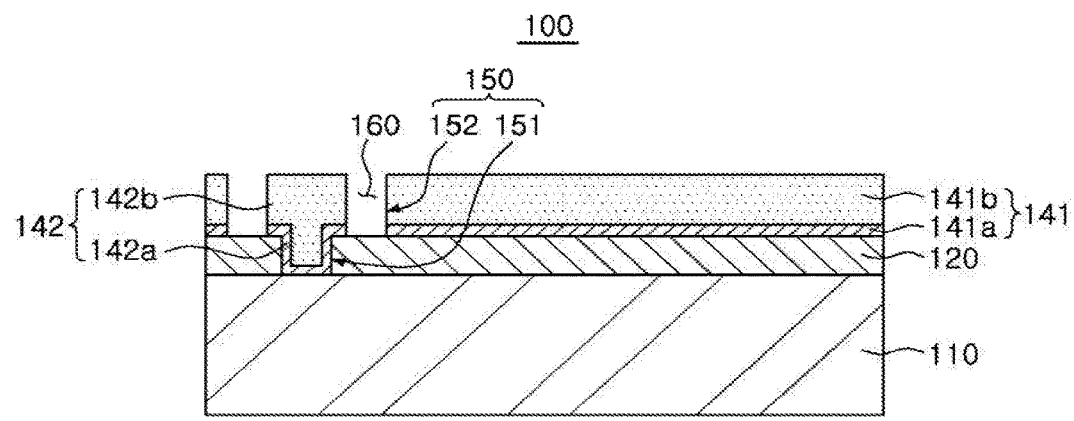
FIG. 1 schematically illustrates a cross-sectional view of a monolayer thin film capacitor according to an exemplary embodiment in the present disclosure.
Figure 2:
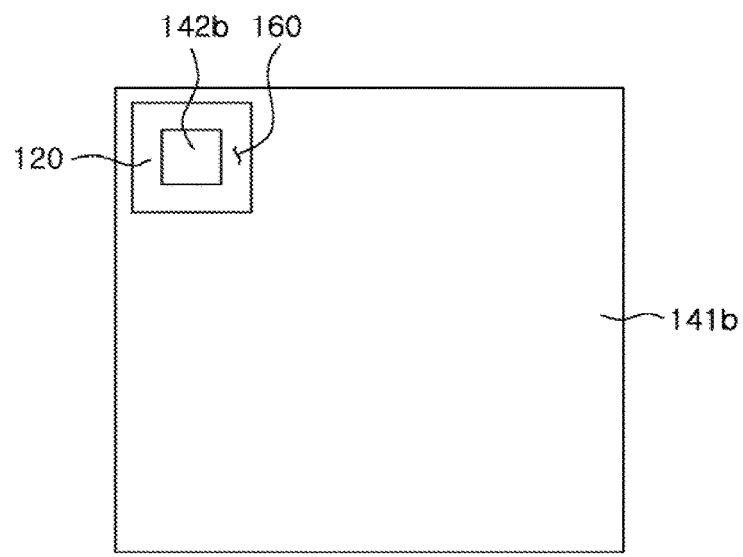
FIG. 2 schematically illustrates a plan view of the monolayer thin film capacitor according to an exemplary embodiment in the present disclosure.

FIG. 1 schematically illustrates a cross-sectional view of a monolayer thin film capacitor 100 according to an exemplary embodiment in the present disclosure, and FIG. 2 schematically illustrates a plan view of the monolayer thin film capacitor 100 according to an exemplary embodiment in the present disclosure.

Hereinafter, a structure of the monolayer thin film capacitor 100 according to an exemplary embodiment in the present disclosure will be described with reference to FIGS. 1 and 2.

The monolayer thin film capacitor 100 according to an exemplary embodiment may include a bottom electrode 110, a dielectric layer 120, a top electrode 141, and a connection electrode 142.

As the bottom electrode 110, a substrate formed of a metal material may be used.

The dielectric layer 120 may be formed on the bottom electrode 110. The dielectric layer 120 may be formed of a high dielectric material such as $BaTiO_3$ (BTO), $SrTiO_3$ (STO), (Ba, Sr) $TiO_3$ (BST), Pb (Zr, Ti) $O_3$ (PZT), or $SrBiTaO_9$ (SBT), or $Ta_2O_5$.

A first via 151 may be disposed in the dielectric layer 120. The first via 151 penetrates through the dielectric layer 120, so that a portion of the bottom electrode 110 disposed below the dielectric layer 120 is exposed through the first via 151.

The top electrode 141 may be disposed on the dielectric layer 120.

The top electrode 141 may include a first top metal layer 141*a* and a second top metal layer 141*b*.

The first top metal layer 141*a* may serve to improve adhesiveness between the dielectric layer 120 and the second top metal layer 141*b*.

In a case in which the monolayer thin film capacitor is embedded in a printed circuit board, the monolayer thin film capacitor may be electrically connected to an external power source through a copper (Cu) via of the printed circuit board.

The copper (Cu) via may be formed by forming a via in the printed circuit board using laser and filling copper in the formed via by a plating method.

In the process of forming a via in a printed circuit board described above, a laser etching needs to be performed at a depth of the extent that the top electrode of the embedded monolayer thin film capacitor is not damaged. In a case in which the top electrode is formed of conductive pastes, it is difficult to adjust the etching depth.

Therefore, an uppermost layer of the top electrode, that is, the second top metal layer 141*b* may be a copper plating layer formed by plating copper. However, a plating material of the second top metal layer 141*b* is not limited to copper, and the second top metal layer 141*b* may be a plating layer using the same metal as a metal filled in the via at the time of forming the via in the printed circuit board.

As such, in a case in which the second top metal layer 141*b* is formed by plating, it is difficult to directly form the plating layer on the dielectric layer 120. Further, although a metal layer is formed on the dielectric layer 120 by a method such as direct plating, deposition, or the like, there is a problem that adhesiveness between the dielectric layer 120 and the metal layer directly formed thereon is degraded.

Therefore, the first top metal layer 141*a* may be disposed between the second top metal layer 141*b* and the dielectric layer 120.

The first top metal layer 141*a* may be formed by using conductive pastes that partially include the same dielectric material as the dielectric layer 120 as an addition agent and partially include the same metal powder as a metal material used for the second top metal layer 141*b*. Alternatively, the first top metal layer 141*a* may be formed of a metal having excellent adhesiveness with the dielectric layer 120 and the second top metal layer 141*b* using a sputtering method.

That is, the first top metal layer 141*a* may have excellent adhesiveness with respect to all of the dielectric layer 120 and the second top metal layer 141*b*.

A second via 152 may be disposed in the top electrode 141. The second via 152 may penetrate through the top electrode 141, and may be disposed to have a center which coincides with a center of the first via 151 in plan view.

In other words, the second via 152 does not penetrate through a separate protection layer, but may be disposed to penetrate through the top electrode 141.

The connection electrode 142 may be disposed on inner surfaces of the first via 151 and the second via 152. The connection electrode 142 may be connected to the bottom electrode 110 to allow the bottom electrode 110 to be electrically connected to the external power source.

The connection electrode 142 may include a first connection metal layer 142*a* and a second connection metal layer 142*b*.

The first connection metal layer 142*a* may serve to improve adhesiveness between the dielectric layer 120 and the second connection metal layer 142*b*.

In a case in which the monolayer thin film capacitor is embedded in a printed circuit board, the monolayer thin film capacitor may be electrically connected to an external power source through a copper (Cu) via of the printed circuit board.

The copper (Cu) via may be formed by forming a via in the printed circuit board using laser drilling and filling copper in the formed via using a plating method.

In the process of forming a via in a printed circuit board described above, laser etching needs to be performed to a depth to the extent that the connection electrode of the embedded monolayer thin film capacitor is not damaged. In a case in which the connection electrode is formed of conductive pastes, it is difficult to adjust the etching depth.

Therefore, an uppermost layer of the connection electrode, that is, the second connection metal layer 142*b* may be a copper plating layer formed by plating copper. However, a plating material of the second connection metal layer 142*b* is not limited to copper, and the second connection metal layer 142*b* may be a plating layer using the same metal as a metal filled in the via at the time of forming the via in the printed circuit board.

As such, in a case in which the second connection metal layer 142*b* is formed by plating, it is difficult to directly form the plating layer on the dielectric layer 120. Further, although a metal layer is formed on the dielectric layer 120 by a method such as direct plating, deposition, or the like, there is a problem that adhesiveness between the dielectric layer 120 and the metal layer directly formed thereon is degraded.

Therefore, the first connection metal layer 142*a* may be disposed between the second connection metal layer 142*b* and the dielectric layer 120.

The first connection metal layer 142*a* may be formed by using conductive pastes that partially include the same dielectric material as the dielectric layer 120 as an addition agent and partially include the same metal powder as a metal material used for the second connection metal layer 142*b*. Alternatively, the first connection metal layer 142*a* may be formed of a metal having excellent adhesiveness with the dielectric layer 120 and the second connection metal layer 142*b* using a sputtering method.

That is, the first connection metal layer 142*a* may have excellent adhesiveness with respect to all of the dielectric layer 120 and the second connection metal layer 142*b*.

The connection electrode 142 may be disposed to fill the first via 151, but may be disposed to fill only a portion of the second via so as to be spaced apart from wall surfaces of the second via 152 with regard to the second via 152.

In particular, the second via 152 may be disposed to have a greater width or a greater diameter than that of the first via 151. Since the width or the diameter of the second via 152 is greater than that of the first via 151, it is possible to prevent the connection electrode 142 from being connected to the top electrode 141 without a separate insulating member.

That is, a space 160 may be disposed between the second via 152 and the connection electrode 142.

Referring to FIG. 2, it may be seen that in the monolayer thin film capacitor 100 according to an exemplary embodiment, the connection electrode 142 is disposed inside of the dielectric layer 120 in plan view, unlike a monolayer thin film capacitor according to the related art.

That is, since a separate area in plan view is not required to connect the bottom electrode 110 and the external power source to each other, an occupancy area of the monolayer thin film capacitor may be significantly reduced when the same capacitor capacity is required. On the contrary, with regard to the same occupancy area, capacity of the monolayer thin film capacitor may be significantly increased.

In addition, referring to FIG. 2, it may be seen that the connection electrode 142 is disposed inside of the space 160 in plan view, and the top electrode 141 is disposed around the space 160.

That is, it may be seen that the top electrode 141 is disposed on the entirety of an upper surface of the dielectric layer 120, except for the minimum space 160 for insulating the connection electrode 142 and the top electrode 141 from the upper surface of the dielectric layer 120.

The capacity of the monolayer thin film capacitor may be determined by an area in which the top electrode and the bottom electrode overlap each other while having the dielectric layer disposed therebetween.

In the monolayer thin film capacitor 100 according to an exemplary embodiment, since the bottom electrode 110 is disposed to be in contact with the entirety of a low surface of the dielectric layer 120, and the top electrode 141 is disposed on the entirety of the upper surface of the dielectric layer 120, except for the minimum space 160 for insulating the connection electrode 142 and the top electrode 141 from the upper surface of the dielectric layer 120, the area in which the top electrode 141 and the bottom electrode 110 overlap each other while having the dielectric layer 120 disposed therebetween may be significantly increased.

Therefore, the monolayer thin film capacitor 100 according to an exemplary embodiment may have significantly increased capacity while retaining the same occupancy area, or may have a significantly reduced occupancy area while retaining the same target capacity.

In particular, since the monolayer thin film capacitor 100 according to an exemplary embodiment does not need the protection layer covering upper portions of the top electrode 141 and the connection electrode 142 when the top electrode 141 and the connection electrode 142 are insulated from each other, or the top electrode 141 or the connection electrode 142 is formed, a thickness of the monolayer thin film capacitor 100 may be significantly reduced.

Figure 3:
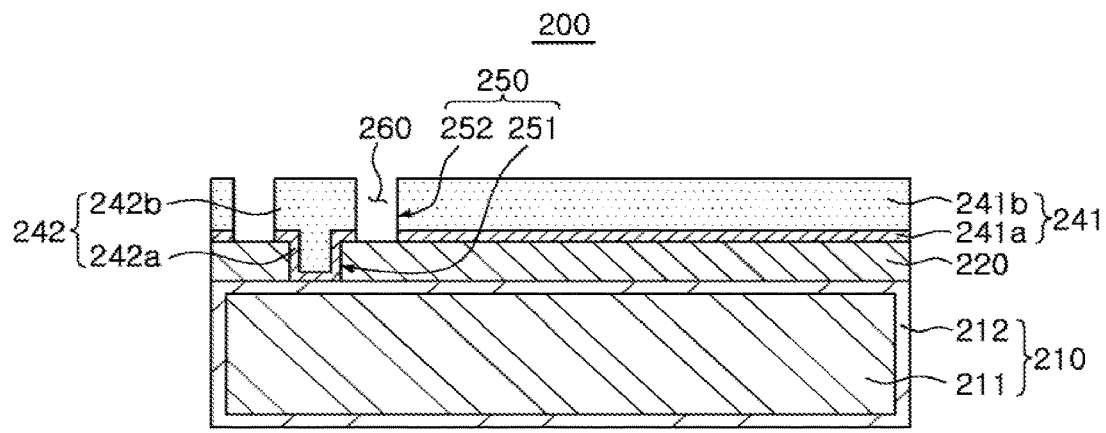
FIG. 3 schematically illustrates a cross-sectional view of a monolayer thin film capacitor according to another exemplary embodiment in the present disclosure.

FIG. 3 schematically illustrates a cross-sectional view of a monolayer thin film capacitor 200 according to another exemplary embodiment in the present disclosure.

In FIG. 3, a description of the same components as those described with reference to FIGS. 1 and 2 will be omitted.

Referring to FIG. 3, a bottom electrode 210 of the monolayer thin film capacitor 200 according to another exemplary embodiment may include a substrate 211 formed of a metal material, and a bottom metal layer 212 plated on the substrate 211. The bottom metal layer 212 may be nickel (Ni).

The bottom electrode 210 of the monolayer thin film capacitor 200 according to another exemplary embodiment may be manufactured by using a material having a similar coefficient of thermal expansion as that of a dielectric layer 220, and as a result, reliability of the monolayer thin film capacitor 200 may be improved.

Method for Manufacturing Monolayer Thin Film Capacitor

FIGS. 4 through 15 schematically illustrate a method for manufacturing a monolayer thin film capacitor according to another exemplary embodiment in the present disclosure.

A method for manufacturing a monolayer thin film capacitor according to another exemplary embodiment in the present disclosure will be described with reference to FIGS. 4 through 15.

Figure 4:
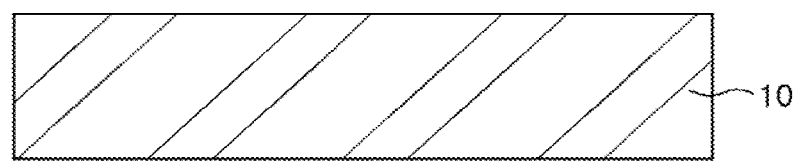
FIGS. 4 through 15 schematically illustrate a method for manufacturing a monolayer thin film capacitor according to another exemplary embodiment in the present disclosure.

First, an operation of preparing a bottom electrode 10 may be performed (FIG. 4).

The bottom electrode 10 may serve as a substrate in operations of manufacturing a monolayer thin film capacitor to be described below.

The bottom electrode 10 may be a substrate formed of a metal material, but is not limited thereto. For example, the bottom electrode may also be a silicon (Si) substrate on which a metal layer is formed.

Alternatively, as illustrated in FIG. 3, the bottom electrode 10 may include the substrate formed of the metal material and the bottom metal layer plated on the substrate.

After the bottom electrode 10 is prepared, an operation of forming a dielectric layer 20 and a first via 51 on the bottom electrode 10 may be performed (FIGS. 5 through 9).

Figure 5:
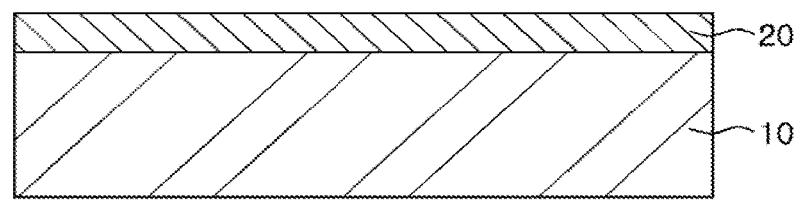

First, the dielectric layer 20 may be formed on the bottom electrode 10 (FIG. 5).

The dielectric layer 20 may be formed of a high dielectric material such as $BaTiO_3$ (BTO), $SrTiO_3$ (STO), (Ba, Sr)$TiO_3$ (BST), Pb (Zr, Ti) $O_3$ (PZT), or $SrBiTaO_9$(SBT), or $Ta_2O_5$.

The operation of forming a dielectric layer 20 may be performed by using a screen printing method, a coating method, a sol-gel method, a chemical vapor deposition (CVD) method, or the like.

Figure 6:
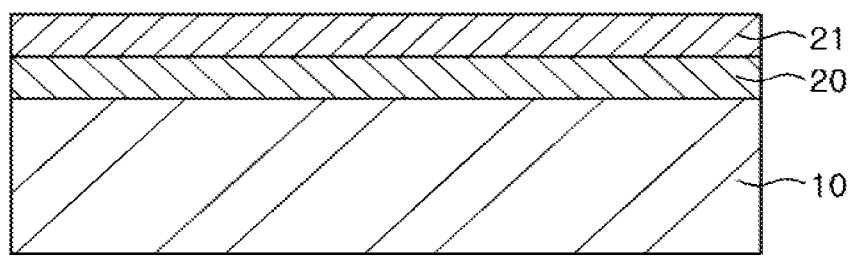

A first via formation member 21 may be formed on the formed dielectric layer 20 (FIG. 6).

The first via formation member 21 may be a photoresist.

Figure 7:
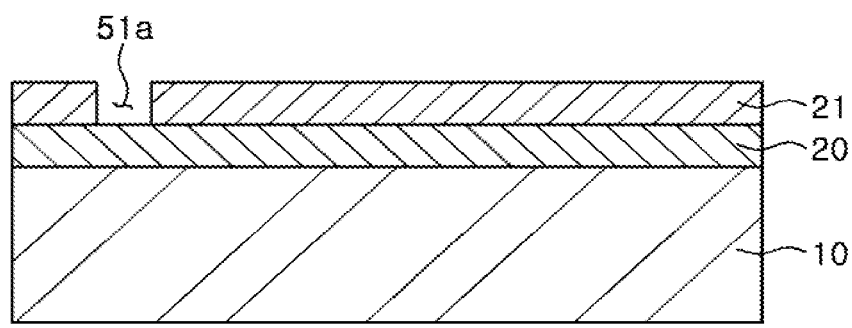

In the case in which the first via formation member 21 is the photoresist, a first etching region 51a may be formed by removing the first via formation member 21 in a region in which a first via 51 is to be formed (FIG. 7).

Figure 8:
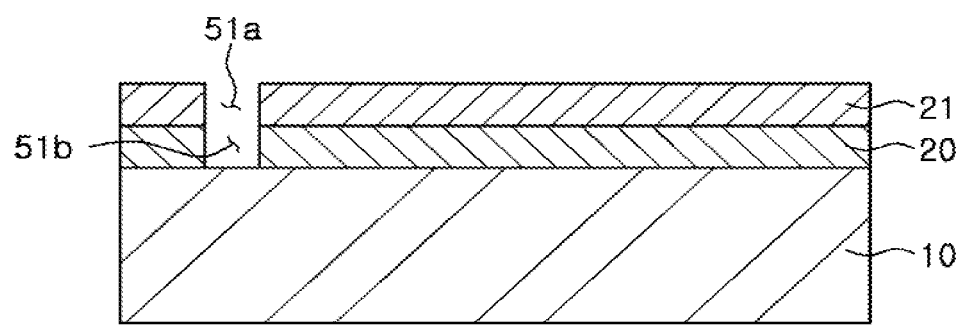

Thereafter, a second etching region 51b may be formed in the dielectric layer 20 by etching the dielectric layer 20 (FIG. 8).

Figure 9:
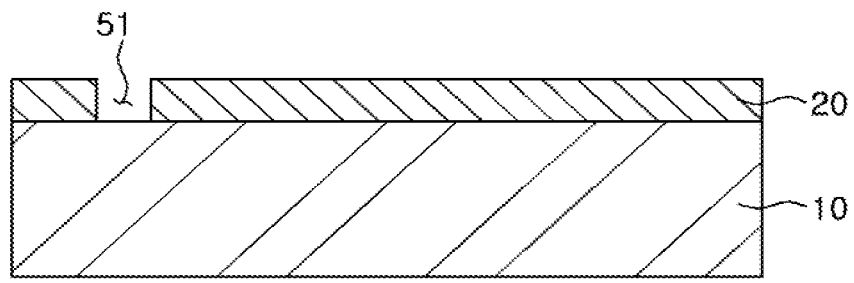

The first via 51 and the dielectric layer 20 may be formed by removing the first via formation member 21 (FIG. 9).

In the operation of forming the dielectric layer 20 and the first via 51 on the bottom electrode 10 after the preparing of the bottom electrode 10, unlike the above-mentioned description, after the first via formation member is disposed in a region corresponding to the first via 51 on the bottom electrode 10 and the dielectric layer 20 is then formed, the first via 51 and the dielectric layer 20 may also formed by removing the first via formation member.

Figure 10:
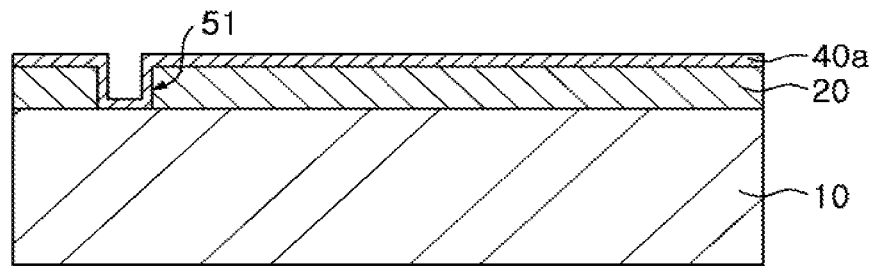

Next, as illustrated in FIG. 10, a first metal layer 40a may be formed. The first metal layer 40a may be formed by using conductive pastes that partially include the same dielectric material as the dielectric layer 20 as an addition agent and partially include the same metal powder as a metal material used for a second metal layer 40b to be described below. Alternatively, the first metal layer 40a may be formed of a metal having excellent adhesiveness with the dielectric layer 120 and the second metal layer 40b using a sputtering method.

Figure 11:
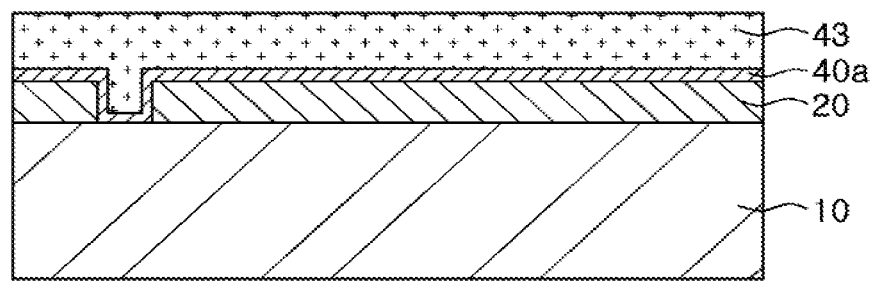
Figure 12:
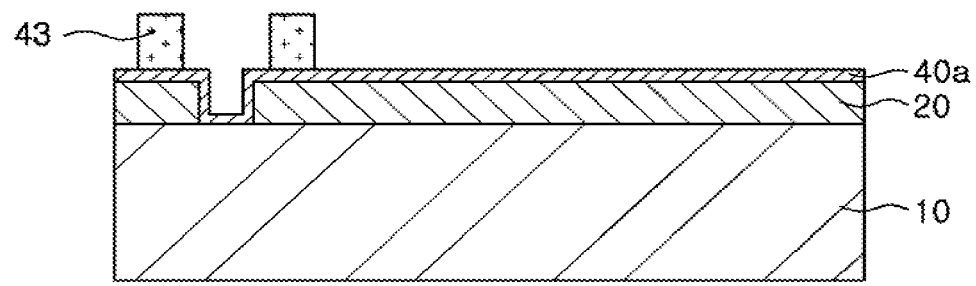
Figure 13:
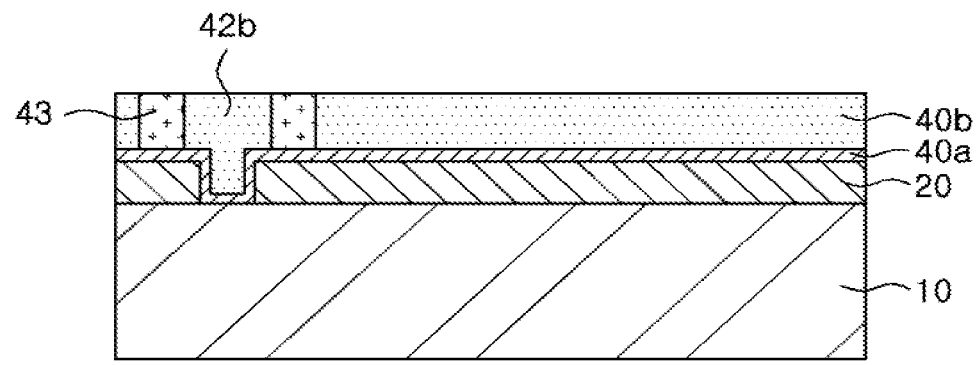

After the first metal layer 40a is formed, an operation of forming the second metal layer 40b in which a second via 52 is formed may be performed (FIGS. 11 through 13).

First, a second via formation member 43 may be formed on the first metal layer 40a (FIG. 11). The second via formation member 43 may be a photoresist.

Thereafter, as illustrated in FIG. 12, the second via formation member 43 may be removed to leave only a portion of the second via formation member 43, corresponding to a first metal layer etching region 60' to be described below, remaining.

In this case, the second via formation member 43 may be disposed on the dielectric layer 20, and may be disposed around the first via 51. Therefore, when a second via 52 is formed as described below, the second via 52 may have a greater width or a greater diameter than that of the first via 51.

Next, the second metal layer 40b may be formed by a method such as plating, or the like (FIG. 13). In the case of a substrate embedding monolayer thin film capacitor, the second metal layer 40b may be formed of copper (Cu).

Figure 14:
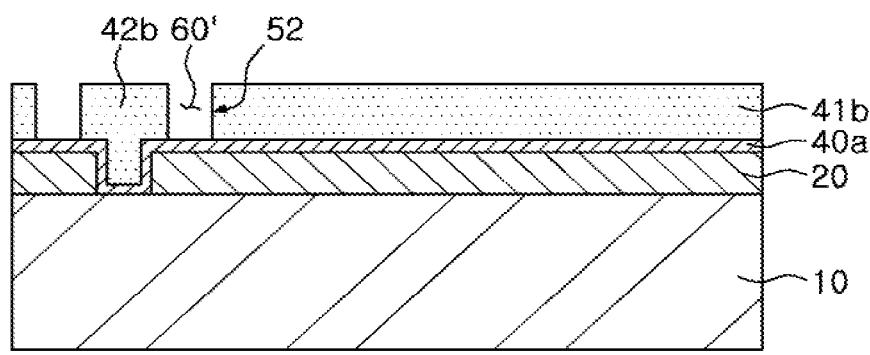

Thereafter, as illustrated in FIG. 14, the first metal layer etching region 60' may be formed by removing the second via formation member 43.

Figure 15:
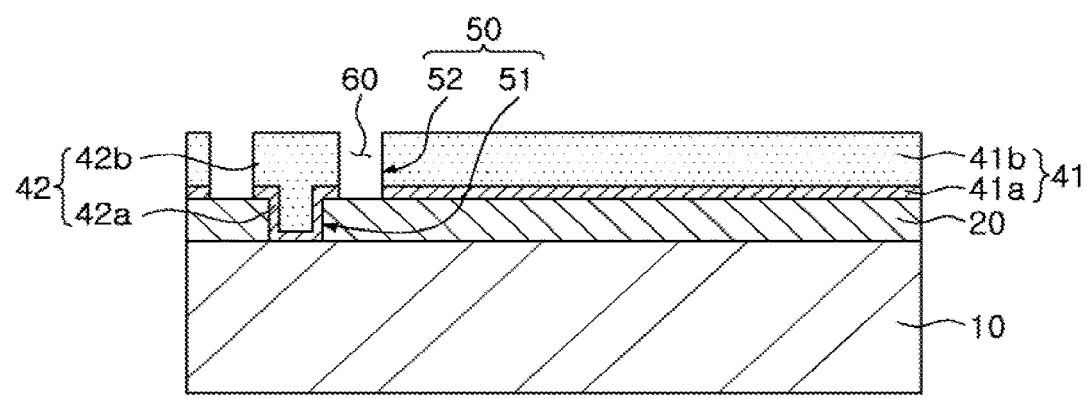

Thereafter, as illustrated in FIG. 15, a top electrode 41 and a connection electrode 52 may be formed by etching the first metal layer 40a exposed through the first metal layer etching region 60', and a portion from which the first metal layer etching region 60', that is, the second via formation member 43 is removed may become a space 60.

As described above, in the method for manufacturing a monolayer thin film capacitor according to another exemplary embodiment, when an operation of simultaneously forming the first via at the time of forming the dielectric layer is selected, the number of operations may be significantly reduced.

Further, the method for manufacturing a monolayer thin film capacitor according to another exemplary embodiment does not include the operation of forming the separate protection layer, whereby the number of operations may be more significantly reduced.

Board in which Monolayer Thin Film Capacitor is Embedded

Figure 16:
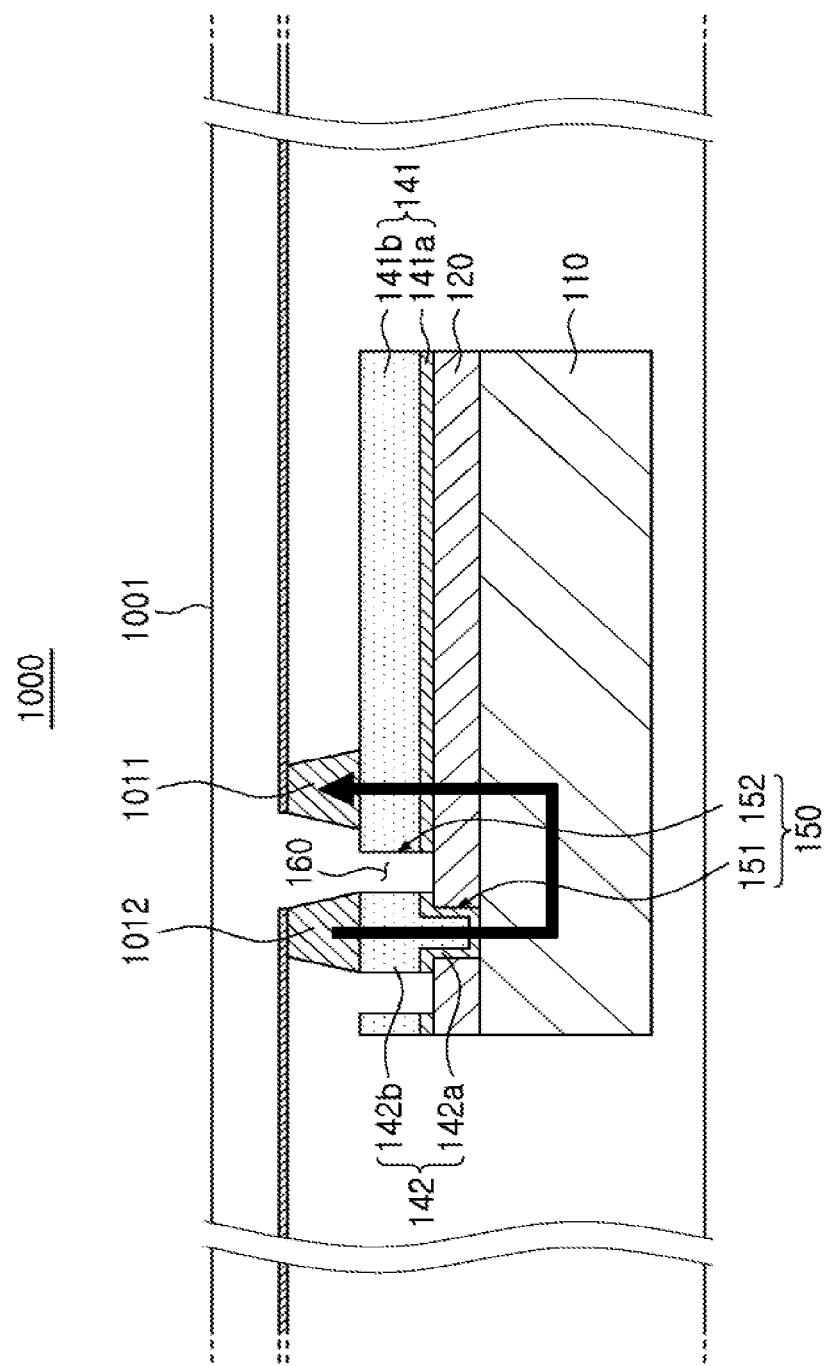
FIG. 16 schematically illustrates a cross-sectional view of a board in which a monolayer thin film capacitor is embedded according to another exemplary embodiment in the present disclosure.

FIG. 16 schematically illustrates a cross-sectional view of a board in which a monolayer thin film capacitor is embedded according to another exemplary embodiment in the present disclosure.

Referring to FIG. 16, a board 1000 in which a monolayer thin film capacitor is embedded according to another exemplary embodiment may include a substrate 1001, a first terminal electrode 1011, and a second terminal electrode 1012, and may embed the monolayer thin film capacitor according to an exemplary embodiment.

The first terminal electrode 1011 may be electrically connected to a top electrode 141, and the second terminal electrode 1012 may be electrically connected to a connection electrode 142.

Since the monolayer thin film capacitor according to an exemplary embodiment does not need the protection layer covering the upper portions of the top electrode 141 and the connection electrode 142 when the top electrode 141 and the connection electrode 142 are insulated from each other, or the top electrode 141 or the connection electrode 142 is formed, as described above, a thickness of the monolayer thin film capacitor may be significantly reduced. That is, since the protection layer is not necessary when the top electrode 141 and the connection electrode 142 are formed, thicknesses of the top electrode 141 and the connection electrode 142 may be significantly reduced.

In a case in which the monolayer thin film capacitor is embedded in the substrate 1001, a current may flow as indicated by an arrow in FIG. 16.

According to the related art, in the case of a capacitor embedded in the substrate, the protection layer may be formed to insulate and protect the respective electrodes, and a thickness of the electrode may be increased as much as a thickness of the protection layer.

A magnetic flux amount that determines equivalent series inductance (ESL) may be proportional to an area of a loop in which the current flows.

A board embedded-type capacitor according to the related art cannot help having a thicker thickness of the electrode than that of the electrode according to the present disclosure due to the protection layer.

Therefore, since the monolayer thin film capacitor or the board 1000 in which the monolayer thin film capacitor is embedded does not need the protection layer when the top electrode 141 and the connection electrode 142 are formed, the thicknesses of the top electrode 141 and the connection electrode 142 may be significantly reduced, whereby the area of the loop in which the current flows may be significantly reduced, and ESL may be decreased.

As set forth above, according to the exemplary embodiments in the present disclosure, in the monolayer thin film capacitor, since the connection electrode and the top electrode disposed on the dielectric layer do not need the separate protection layer, the height of the monolayer thin film capacitor may be significantly reduced.

Further, in the monolayer thin film capacitor according to an exemplary embodiment, since the substrate based on the metal disposed below the dielectric layer is electrically connected to the external power source through the connection electrode disposed on the inner surfaces of the first and second vias, the occupancy area of the monolayer thin film capacitor may be significantly reduced.

In the method for manufacturing a monolayer thin film capacitor according to another exemplary embodiment in the present disclosure, the first via is simultaneously formed at the time of forming the dielectric layer, whereby the number of operations may be significantly reduced.

Further, the method for manufacturing a monolayer thin film capacitor according to another exemplary embodiment in the present disclosure does not include the operation of forming the separate protection layer, whereby the number of operations may be more significantly reduced.

While exemplary embodiments have been shown and described above, it will be apparent to those skilled in the art that modifications and variations could be made without departing from the scope of the present invention as defined by the appended claims.

What is claimed is:

1. A thin film capacitor comprising:
   a bottom electrode;
   a top electrode;
   a dielectric layer disposed between the top and bottom electrodes;
   a first via formed in the dielectric layer so as to penetrate through the dielectric layer;
   a second via formed in the top electrode so as to penetrate through the top electrode; and
   a connection electrode disposed on inner sides of the first and second vias, electrically connected to the bottom electrode, and electrically insulated from the top electrode,
   wherein a space exists in the second via and between the connection electrode and the top electrode.

2. The thin film capacitor of claim 1, wherein no insulating member is disposed in the second via and between the connection electrode and the top electrode.

3. The thin film capacitor of claim 1, wherein the top electrode includes:
   a first top metal layer; and a second top metal layer, and
wherein the first top metal layer is disposed between the second top metal layer and the dielectric layer, and
the first top metal layer improves adhesiveness between the dielectric layer and the second top metal layer.

4. The thin film capacitor of claim 3, wherein the second via has a width or a diameter greater than that of the first via.

5. The thin film capacitor of claim 3, wherein the first top metal layer includes the same dielectric material as the dielectric layer and includes the same metal powder as a metal material for forming the second top metal layer.

6. The thin film capacitor of claim 1, wherein the connection electrode includes a first connection metal layer and a second connection metal layer, and
the first connection metal layer is disposed between the bottom electrode and the second connection metal layer, and between the dielectric layer and the second connection metal layer.

7. The thin film capacitor of claim 1, wherein the bottom electrode includes:
a substrate formed of a metal material; and
a bottom metal layer disposed on a surface of the substrate.

8. The thin film capacitor of claim 1, wherein no protection layer is disposed on the top electrode and the connection electrode, and a thickness of the entire thin film capacitor is determined by thicknesses of the bottom electrode, the dielectric layer, and the top electrode.

* * * * *